United States Patent [19]

Kobayashi et al.

[11] 4,434,325
[45] Feb. 28, 1984

[54] VOLUME CONTROL FOR AN AUDIO APPARATUS

[75] Inventors: Kozo Kobayashi, Kodaira; Mamoru Minamishima, Higashimurayama, both of Japan

[73] Assignee: Nakamichi Corporation, Tokyo, Japan

[21] Appl. No.: 396,772

[22] Filed: Jul. 9, 1982

[30] Foreign Application Priority Data

Jul. 16, 1981 [JP] Japan .......................... 56-104679[U]

[51] Int. Cl.³ .............................................. H03G 3/02
[52] U.S. Cl. ...................................... 381/104; 369/3; 381/105; 381/119
[58] Field of Search ............ 179/1 VL, 1 D; 455/232, 455/220, 211; 369/3, 4; 84/1.27, 1.26

[56] References Cited

U.S. PATENT DOCUMENTS 3,020,343  2/1962  Aldridge, Jr. ................... 179/1 VL Primary Examiner—G. Z. Rubinson
Assistant Examiner—James Dwyer
Attorney, Agent, or Firm—Pearne, Gordon, Sessions, McCoy, Granger & Tilberry

[57] ABSTRACT

This invention relates to a volume control for an audio apparatus and more particularly to a fader for fading in or out a level of an audio signal. The volume control of the invention comprises a charge and discharge circuit having a capacitor charged and discharged by a constant current in response to a fade-in or fade out operation, and a function generator to generate a signal having a logarithmic waveform periodically repeated. A control signal generator compares the voltage across the capacitor of the charge and discharge circuit with the logarithmic waveform signal from the function generator to generate a control signal logarithmically varying in accordance with variation in the voltage across the capacitor of the charge and discharge circuit. An impedance controller logarithmically changes an impedance of an audio signal line in accordance with the control signal to logarithmically change the level of the audio signal in substance.

5 Claims, 6 Drawing Figures

VOLUME CONTROL FOR AN AUDIO APPARATUS

BACKGROUND OF THE INVENTION

In case of recording an audio signal such as music by means of a tape recorder, it is sometimes required that a recording level of the audio signal is slowly raised or lowered at the begining or ending portion of the music by a fade-in or fade-out operation. In a prior art, since the fade-in or fade-out operation is made by manually controlling a knob of a volume, it is very difficult of fade in or out the sound in a smooth manner. This means that no ideal fade-in or fade-out effect can be obtained.

SUMMARY OF THE INVENTION

Accordingly, it is a principal object of the invention to provide a volume control for an audio apparatus adapted to automatically and logarithmically vary in a level of an audio signal in accordance with a fade-in or fade-out operation without any manual operation of the control.

It is another object of the invention to provide a volume control for a tape recorder adapted to record an audio signal with a proper lever so as to obtain a natural reproduced sound.

In accordance with the invention, there is provided a volume control for an audio apparatus comprising;

a charge and discharge circuit having a capacitor charged and discharged by a constant current in response to one of fade-in and fade-out operations;

a function generator to generate a signal having a logarithmic waveform periodically repeated;

control signal generating means to compare a voltage across said capacitor with said logarithmic waveform signal from said function generator to generate a control signal logarithmically varying in accordance with variation in said voltage across said capacitor;

and impedance control means to logarithmically change an impedance of an audio signal line in accordance with said control signal to logarithmically change the level of said audio signal in substance.

BRIEF DESCRIPTION OF THE DRAWINGS

The above and other objects and features of the invention will be apparent from the description of the embodiment taken along with the accompanying drawings in which.

DETAILED DESCRIPTION OF THE EMBODIMENT

Figure 1:
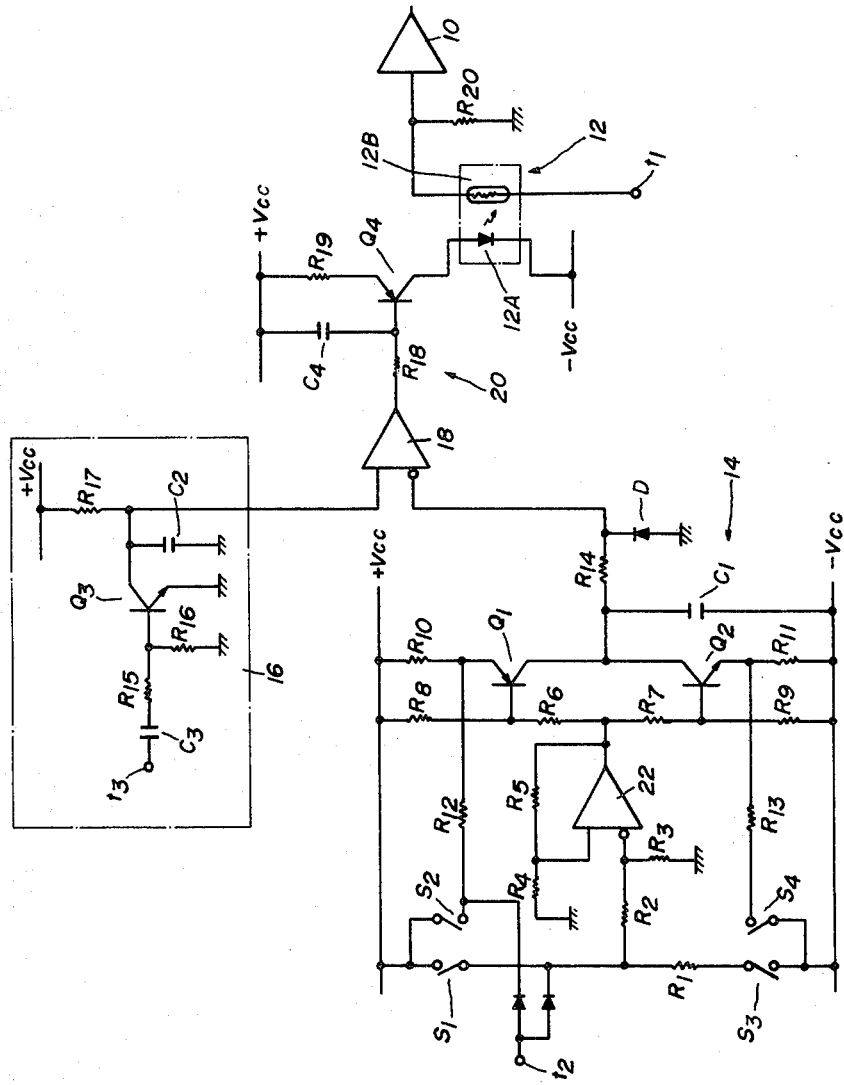
FIG. 1 is a schematic diagram of a volume control for a tape recorder constructed in accordance with the invention.

Referring now to FIG. 1, there is shown a volume control for a tape recorder wherein impedance control means 12 is disposed in an audio signal line leading from an input terminal $t_1$ to a recording amplifying circuit 10. In the illustrated embodiment, the impedance control means 12 comprises a photo-coupler including a luminous dode 12A and a photo-electric cell 12B varying in its resistance in an inverse proportion to a quantity of light from the luminous diode 12A. The photo-electric cell 12B is disposed between the input terminal $t_1$ and a recording amplifying circuit 10, serving as an impedance element changing a level of an audio signal together with a divided resistor $R_{20}$.

The volume control of the invention further comprises a charge and discharge circuit 14 having a capacitor $C_1$ charged by a constant current when a fade-in switch $S_1$ or $S_2$ is operated and discharged by a constant current when a fade-out switch $S_3$ or $S_4$ is operated, a function generator 16 to generate a signal having a logarithmic waveform periodically repeated, and a control signal generating circuit 20 including a voltage comparator 18 to compare voltage across the capacitor $C_1$ with the logarithmic waveform signal from the function generator 16 to generate a control signal logarithmically varying in response to variation in the voltage across the capacitor $C_1$.

As shown in FIG. 1, the charge and discharge circuit 14 comprises a transistor $Q_1$ connected in series to the capacitor $C_1$ between D.C. potentials $+V_{cc}$ and $-V_{cc}$, a transistor $Q_2$ connected in parallel to the capacitor $C_1$, a voltage comparator 22, an output terminal of which is connected to bases of the transistors $Q_1$ and $Q_2$, and resistors $R_1$ through $R_{14}$ and a diode D. In FIG. 1, a control signal is applied to a terminal $t_2$ in response to an operation of a mode selecting switch of a tape recorder as described in detail later.

The function generator 16 comprises a transistor $Q_3$, capacitors $C_2$ and $C_3$ and resistors $R_{15}$ through $R_{17}$. The function generator 16 generates a signal having a logarithmic waveform periodically repeated in response to the periodical charge and discharge of the capacitor $C_2$ by turn on and off of the transistor $Q_3$ depending on clock pulses applied to a terminal $t_3$ of the function generator 16.

The control signal generating circuit 20 comprises a voltage comparator 18 and an integration circuit of a resistor $R_{18}$ and a capacitor $C_4$ connected to an output terminal of the voltage comparator 18, and a transistor $Q_4$ controlled by the integration circuit and having a resistor $R_{19}$ connected to an emitter thereof.

Figure 2A:
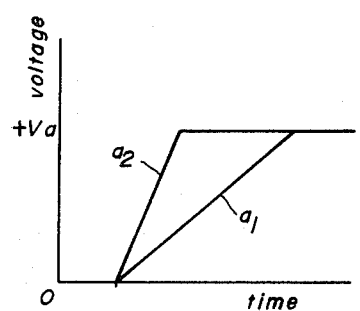
FIGS. 2A and 2B show charge and discharge characteristics of a capacitor in a charge and discharge circuit.

In operation, a signal "Lo" (a low level signal) is applied to the terminal $t_2$ in response to an operation of a recording mode selecting switch of a tape recorder so that a fade-in or fade-out operation is operated. In case of the fade-in operation to be required at the begining portion of music recorded, the fade-in switch $S_1$ is closed. At that time, the $(-)$ input terminal of the voltage comparator 22 becomes the condition of "Hi" (high level condition) so that the output of the voltage comparator 22 is kept on the condition of "Lo" (low level condition). This causes the transistor $Q_1$ to be turned on. Thus, the capacitor $C_1$ is charged by the constant current through the resistor $R_{10}$ and the emitter and collector of the transistor $Q_1$ so that the voltage across the capacitor $C_1$ increases as indicated by the characteristic of $a_1$ in FIG. 2A. It will be noted that if the fade-in switch $S_2$ is also closed together with the fade-in switch $S_1$, then the resistor $R_{12}$ is connected in parallel to the resistor $R_{10}$ so that the capacitor $C_1$ is charged at higher speed. Thus, the voltage across the capacitor $C_1$ increases at higher speed as indicated by the characteristic of $a_2$ in FIG. 2A.

Figure 2B:
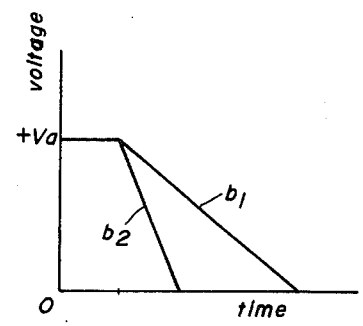

In case of the fade-out operation to be required at the ending of music recorded, the fade-out switch $S_3$ is closed. At that time, the (−) input terminal of the voltage comparator 22 becomes the condition of "Lo" so that the output of the voltage comparator 22 is kept on the condition of "Hi". This causes the transistor $Q_2$ to be turned on. Thus, the charge of the capacitor $C_1$ which is charged during the fade-in operation is discharged by the constant current through the collector and emitter of the transistor $Q_2$ and the resistor $R_{11}$ so that the voltage across the capacitor $C_1$ decreases as indicated by the characteristic of $b_1$ in FIG. 2B. It will be noted that if the fade-out switch $S_4$ is also closed together with the fade-out switch $S_3$, then the resistor $R_{13}$ is connected in parallel to the resistor $R_{11}$ so that the capacitor $C_1$ is discharged at higher speed.

It will be noted that since the resistances of the resistors $R_{10}$ through $R_{13}$ determine the speed at which the capacitor $C_1$ is charged and discharged, they may be set so as to determine the predetermined charging and discharging speed of the capacitor $C_1$.

In FIG. 1, the resistor $R_1$ serves to prevent the charging and discharging circuit 14 from being erroneously operated when the fade-in and fade-out switches $S_1$ and $S_3$ are simultaneously closed with error. The resistors $R_2$ through $R_5$ serve to hold the output conditon of the voltage comparator 22 until the condition of the (−) input terminal thereof changes.

Figure 3:
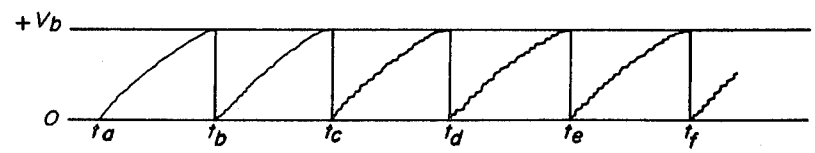
FIGS. 3 shows a waveform of a logarithmic waveform signal from a function generator.

The function generator 16 generates a logarithmic waveform signal shown in FIG. 3 because the capacitor $C_2$ is periodically charged and discharged depending on clock pulses. It should be noted that the output signal from the function generator 16 periodically varies in its waveform in order of $10^{-4}$ second while the charge and discharge of the capacitor $C_1$ is repeated in order of a few seconds.

Figure 4A:
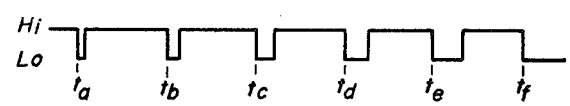
FIGS. 4A and 4B show waveforms of output signals from a voltage comparator in a control signal generating circuit.
Figure 4B:
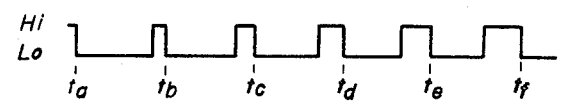

The voltage across the capacitor $C_1$ is applied to the (−) input terminal of the voltage comparator 18 in the control signal generation circuit 20 while the logarithmic waveform signal from the function generator 16 is applied to the (+) input terminal thereof. The voltage comparator 18 compares the voltages with each other to generate a pulse signal from its output terminal. Pulse widths of the pulse signal sequentially became narrower as shown in FIG. 4A when the fade-in switch is operated, and pulse widths of the pulse signal sequentially become wider as shown in FIG. 4B when the fade-out switch is operated. The pulse signal from the control signal generating circuit 20 is supplied to the integration circuit. Therefore, the voltage across the capacitor $C_4$ logarithmically decreases during the fade-in operation while it logarithmically increases during the fade-out operation. Since the voltage across the capacitor $C_4$ is applied to the base of the transistor $Q_4$, a current (a control signal) applied to the impedance control means 12 through the transistor $Q_4$ logarithmically increases in its value during the fade-in operation while the value of the current logarithmically decreases during the fade-out operation.

The photo-coupler in the impedance control means 12 has the resistance of the photo-electric cell 12B varying from 100K to 1K in inverse proportion to the variation of the input current of 0.5 to 30 mA supplied to the luminous diode 12A. Thus, it will be noted that the level of the audio signal recorded logarithmically increases in substance during the fade-in operation while it logarithmically decreases in substance during the fade-out operation. This causes the audio signal to be recorded with a fade-in or fade-out. It will be understood that if only the fade switchs 1 or $S_3$ is closed, then the fading time becomes longer, but that if the fade switch $S_2$ or $S_4$ is also closed together with the fade switch $S_1$ or $S_3$, then the fading time becomes shorter. This will be apparent from the charge and dischagre characteristics of the capacitor $C_1$ (see the line $a_2$ or $b_2$ in FIG. 2A or 2B).

In the above embodiment, the "Hi" signal is applied to the terminal $t_2$ on other modes except for the recording mode of the tape recorder therefore so that the fade operation is impossible on the other modes and the fade-out operation is cancelled in a short time when the other mode except for the recording mode is selected after the fade-out operation terminates on the recording mode.

Although only one preferred embodiment of the invention has been illustrated and described with reference to the accompanying drawings, it will be understood by those skilled in the art that it is by way of example and that various changes and modifications may be made without departing from the spirit and scope of the invention, which is intended to be defined only to the appended claims.

What is claimed is;

1. A volume control for an audio apparatus comprising;
a capacitor charge and discharge circuit having a capacitor charged and discharged by a constant current in response to one of fade-in and fade-out operations;
a function generator to generate a signal having a logarithmic waveform periodically repeated;
control signal generating means to compare a voltage across said capacitor with said logarithmic waveform signal from said function generator to generate a control signal logarithmically varying in accordance with variation in said voltage across said capacitor;
and impedance control means to logarithmically change an impedance of an audio signal line in accordance with said control signal to logarithmically change the level of said audio signal in substance.

2. A volume control for an audio apparatus as set forth in claim 1, and wherein said charge and discharge circuit includes means to change a speed at which said capacitor is charged and discharged.

3. A volume control for an audio apparatus as set forth in claim 2, and wherein said capacitor charge and discharge circuit comprises charging switch means connected in series to said capacitor, discharging switch means connected in parallel to said capacitor, and charging and discharging resistors connected in series to said charging and discharging switches, respectively.

4. A volume control for an audio apparatus as set forth in claim 3, and wherein said means to change a speed at which said capacitor is charged and discharged comprises second charging and discharging resistors connected in parallel to said charging and discharging resistors, respectively.

5. A volume control for an audio apparatus as set forth in claim 1, and wherein said impedance control means comprises a photo-coupler including a luminous diode to which said control signal from said control signal generating means is supplied and a photo-electric cell disposed on said audio signal line to vary in its resistance in response to a quantity of light from said luminous diode.

* * * * *

UNITED STATES PATENT AND TRADEMARK OFFICE
CERTIFICATE OF CORRECTION

PATENT NO. : 4,434,325

DATED : February 28, 1984

INVENTOR(S) : Kozo Kobayashi and Mamoru Minamishima

It is certified that error appears in the above—identified patent and that said Letters Patent is hereby corrected as shown below:

Column 1, line 12, "of" should be --to--

Column 1, line 68, "dode" should be --diode--

Column 4, line 2, "switchs $_1$" should be --switch $S_1$--

Column 4, line 6, "dischagre" should be --discharge--

Signed and Sealed this

Twenty-second Day of May 1984

[SEAL]

Attest:

GERALD J. MOSSINGHOFF

Attesting Officer     Commissioner of Patents and Trademarks